United States Patent
Yoon et al.

(10) Patent No.: US 9,026,749 B2
(45) Date of Patent: May 5, 2015

(54) DATA STORAGE SYSTEM HAVING MULTI-BIT MEMORY DEVICE AND ON-CHIP BUFFER PROGRAM METHOD THEREOF

(75) Inventors: Sangyong Yoon, Seoul (KR); Kitae Park, Seongnam-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 234 days.

(21) Appl. No.: 13/484,712

(22) Filed: May 31, 2012

(65) Prior Publication Data

US 2012/0324178 A1 Dec. 20, 2012

(30) Foreign Application Priority Data

Jun. 14, 2011 (KR) ......... 10-2011-0057432

(51) Int. Cl.
- *G06F 12/00* (2006.01)
- *G11C 11/56* (2006.01)
- *G06F 12/02* (2006.01)
- *G11C 16/34* (2006.01)

(52) U.S. Cl.
CPC ........ *G11C 11/5628* (2013.01); *G06F 12/0246* (2013.01); *G06F 2212/7203* (2013.01); *G11C 16/3418* (2013.01); *G11C 16/3454* (2013.01); *G11C 2211/5641* (2013.01)

(58) Field of Classification Search
USPC ......... 711/100, 113, 118, 143, 161, 162, 165, 711/170
See application file for complete search history.

(56) References Cited

U.S. PATENT DOCUMENTS

| | | | |
|---|---|---|---|
| 5,930,167 A | 7/1999 | Lee et al. | |
| 6,845,435 B2 * | 1/2005 | Nagasawa et al. | ............ 711/162 |
| 6,858,906 B2 | 2/2005 | Lee et al. | |
| 7,130,210 B2 | 10/2006 | Bathul et al. | |
| 7,253,467 B2 | 8/2007 | Lee et al. | |
| 7,257,032 B2 | 8/2007 | Fujiu et al. | |
| 7,391,649 B2 | 6/2008 | Kang et al. | |
| 7,646,664 B2 | 1/2010 | Cho et al. | |
| 7,706,181 B2 * | 4/2010 | Byun et al. | ............... 365/185.03 |
| 7,812,390 B2 | 10/2010 | Park et al. | |
| 7,936,610 B1 | 5/2011 | Melcher et al. | |
| 8,054,684 B2 | 11/2011 | Gorobets et al. | |
| 8,144,512 B2 | 3/2012 | Huang et al. | |
| 8,315,104 B2 | 11/2012 | Futatsuyama et al. | |
| 8,369,142 B2 | 2/2013 | Futatsuyama | |
| 2004/0169238 A1 | 9/2004 | Lee et al. | |
| 2006/0120162 A1 | 6/2006 | Fujiu et al. | |
| 2006/0152974 A1 | 7/2006 | Bathul et al. | |

(Continued)

FOREIGN PATENT DOCUMENTS

| | | |
|---|---|---|
| JP | 2006-228394 A | 8/2006 |
| JP | 2007-242163 | 9/2007 |

(Continued)

*Primary Examiner* — Midys Rojas

(74) *Attorney, Agent, or Firm* — Muir Patent Law, PLLC

(57) ABSTRACT

Disclosed is an on-chip buffer program method for a data storage device which comprises a multi-bit memory device and a memory controller. The on-chip buffer program method includes measuring a performance of the data storage device, judging whether the measured performance satisfies a target performance of the data storage device, and selecting one of a plurality of scheduling manners as an on-chip buffer program scheduling manner of the data storage device according to the judgment result.

16 Claims, 16 Drawing Sheets

(56) References Cited

U.S. PATENT DOCUMENTS

| | | |
|---|---|---|
| 2006/0180851 A1 | 8/2006 | Lee et al. |
| 2007/0211530 A1 | 9/2007 | Nakano |
| 2007/0280000 A1 | 12/2007 | Fujiu et al. |
| 2007/0285980 A1 | 12/2007 | Shimizu et al. |
| 2008/0023747 A1 | 1/2008 | Park et al. |
| 2008/0084729 A1 | 4/2008 | Cho et al. |
| 2010/0008151 A1 | 1/2010 | Hwang |
| 2011/0141811 A1 | 6/2011 | Shimizu et al. |
| 2012/0005415 A1 | 1/2012 | Jung et al. |
| 2012/0170364 A1 | 7/2012 | Jang et al. |

FOREIGN PATENT DOCUMENTS

| | | |
|---|---|---|
| JP | 2007-305210 | 11/2007 |
| JP | 2007-305210 A | 11/2007 |
| JP | 2008-527611 A | 7/2008 |
| KR | 10-0650466 | 11/2006 |
| KR | 673020 | 1/2007 |
| KR | 10-2007-0090020 A | 9/2007 |
| KR | 20070092642 A | 9/2007 |
| KR | 10-2007-0109885 A | 11/2007 |
| KR | 20070109885 A | 11/2007 |
| KR | 20110001098 A | 1/2011 |

\* cited by examiner

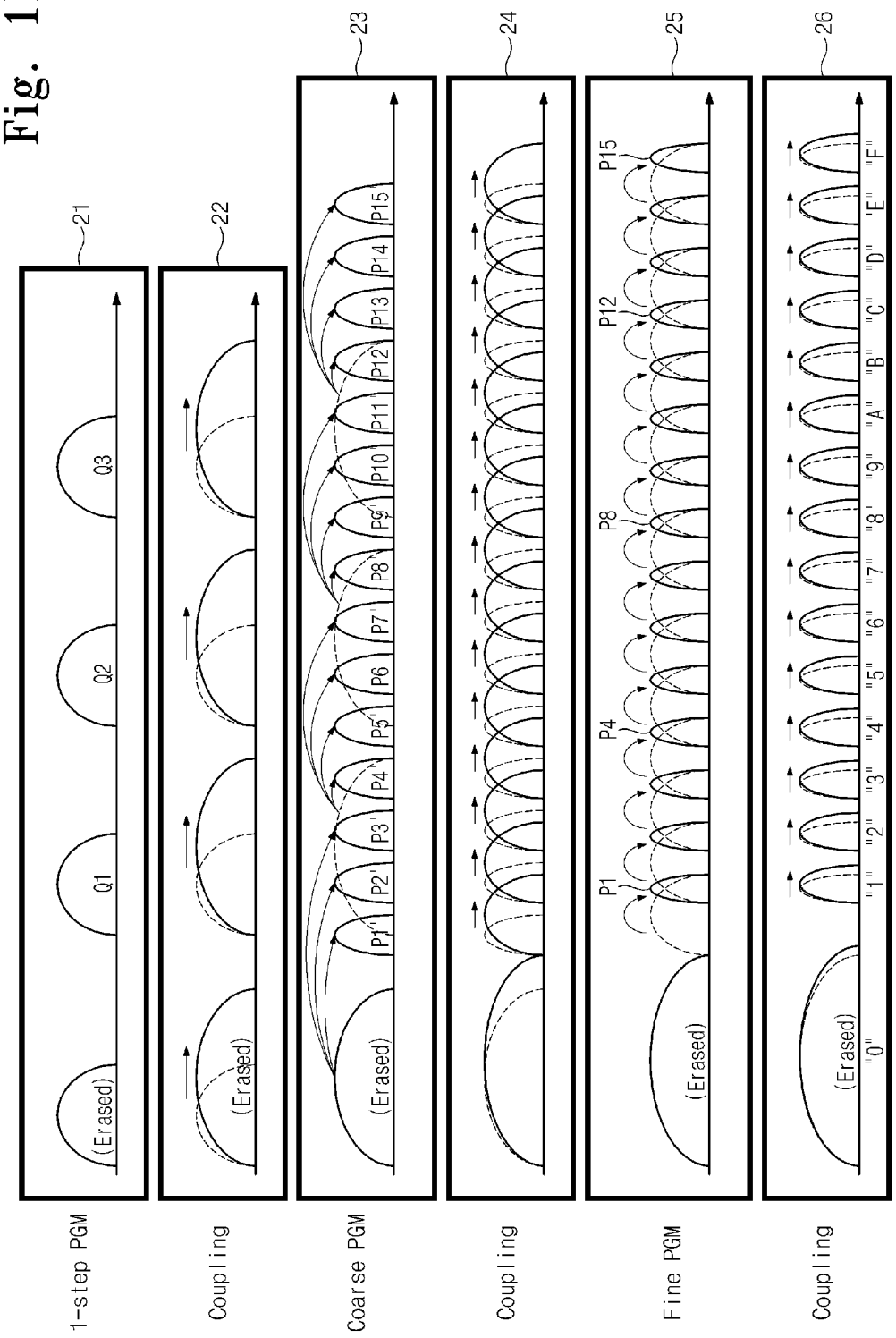

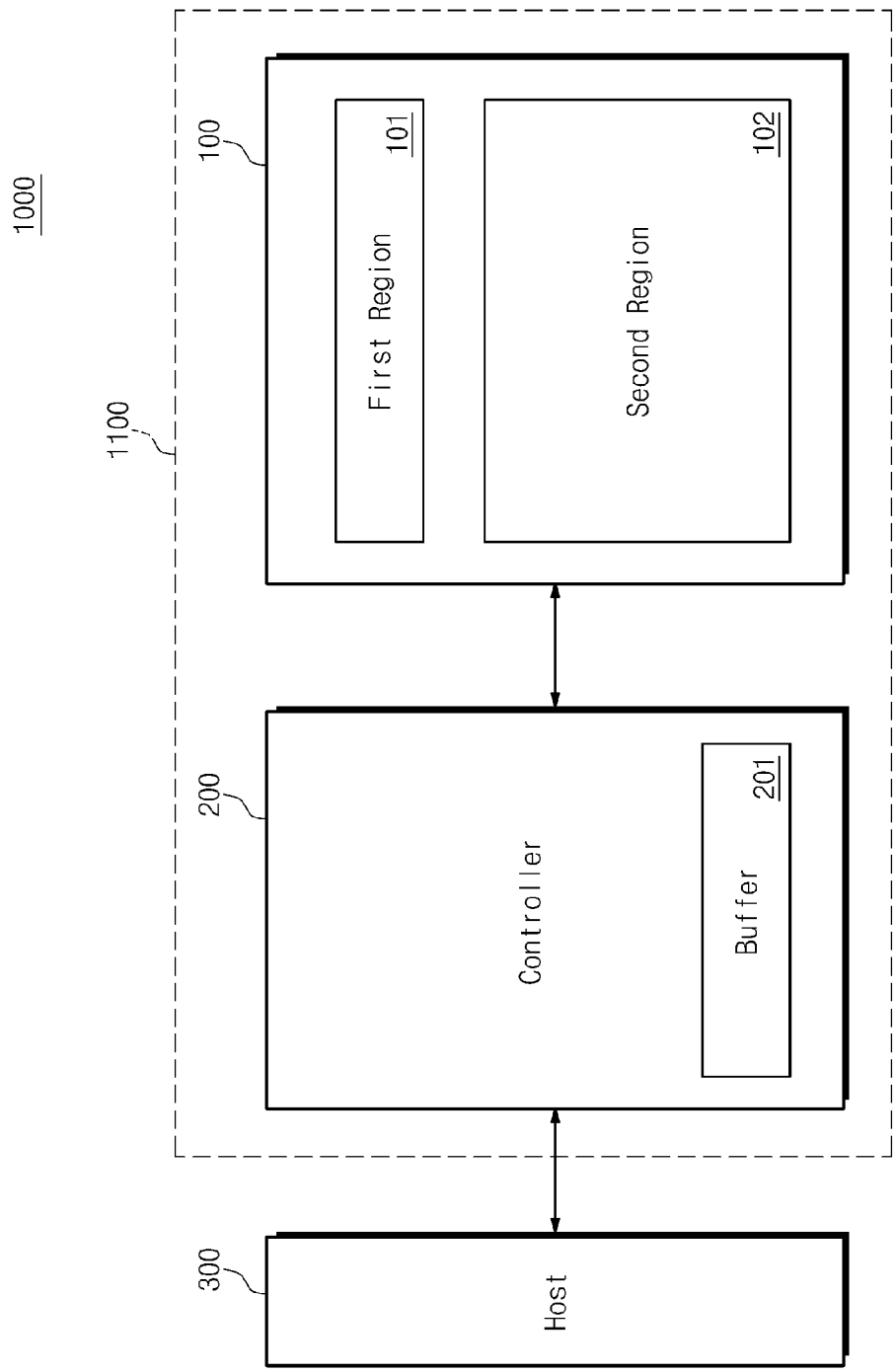

Fig. 4

| WL | 1st | CRS | FIN |
|---|---|---|---|
| 63 | 186,189 | 191 | |
| 62 | 183,187 | 190 | |
| 61 | 180,184 | 188 | |
| ⋮ | ⋮ | ⋮ | ⋮ |
| 3 | 6,10 | 14 | |
| 2 | 3,7 | 11 | |
| 1 | 1,4 | 8 | |
| 0 | 0,2 | 5 | |

· 1st: 1st Step (4-Level)
· CRS: Coarse PGM (8-Level)
· FIN: Fine PGM (8-Level)

Fig. 10

| WL | 1st | CRS | FIN |
|---|---|---|---|
| 63 | 246,250 | 253,255 | |
| 62 | 242,247 | 251,254 | ↙ |
| 61 | 238,243 | 248,252 | ↙ |
| 60 | 234,239 | 244,249 | ↙ |
| 59 | 230,235 | 240,245 | ↙ |
| 58 | 226,231 | 236,241 | ↙ |
| ⋮ | ⋮ | ⋮ | ⋮ |
| 5 | 14,19 | 24,29 | |
| 4 | 10,15 | 20,25 | ↙ |
| 3 | 6,11 | 16,21 | ↙ |
| 2 | 3,7 | 12,17 | ↙ |
| 1 | 1,4 | 8,13 | ↙ |
| 0 | 0,2 | 5,9 | ↙ |

- 1st: $1^{st}$ Step (4-Level)
- CRS: Coarse PGM (16-Level)
- FIN: Fine PGM (16-Level)

DATA STORAGE SYSTEM HAVING MULTI-BIT MEMORY DEVICE AND ON-CHIP BUFFER PROGRAM METHOD THEREOF

CROSS-REFERENCE TO RELATED APPLICATIONS

This application claims the benefit, under 35 U.S.C §119, of Korean Patent Application No. 10-2011-0057432 filed Jun. 14, 2011, the entirety of which is incorporated by reference herein.

BACKGROUND

Exemplary embodiments relate to a storage device, and more particularly, relate to a data storage system.

Semiconductor memory devices are a vital microelectronic component commonly found in digital logic systems, such as computers, and microprocessor-based applications ranging from satellites to consumer electronics. Therefore, advances in the fabrication of semiconductor memory devices, including process enhancements and circuit-design-related developments that allow scaling to higher memory densities and faster operating speeds, help establish performance standards for other digital logic families.

Semiconductor memory devices generally include volatile memory devices, such as random access memory (RAM) devices, and nonvolatile memory devices. In RAM devices, data is stored by either establishing the logic state of a bistable flip-flop such as in a static random access memory (SRAM), or by charging a capacitor in a dynamic random access memory (DRAM). In both SRAM and DRAM devices, data remains stored and may be read as long as the power is applied, but data is lost when the power is turned off.

Mask read-only memory (MROM), programmable read-only memory (PROM), erasable programmable read-only memory (EPROM), and electrically erasable programmable read-only memory (EEPROM) devices are capable of storing the data, even with the power turned off. The non-volatile memory data storage state may be permanent or reprogrammable, depending upon the fabrication technology used. Non-volatile semiconductor memories are used for program and microcode storage in a wide variety of applications in the computer, avionics, telecommunications, and consumer electronics industries. A combination of single-chip volatile as well as non-volatile memory storage modes is also available in devices such as non-volatile SRAM (nvRAM) for use in systems that require fast, reprogrammable non-volatile memory. In addition, dozens of special memory architectures have evolved which contain some additional logic circuitry to optimize their performance for application-specific tasks.

Mask read-only memory (MROM), programmable read-only memory (PROM), and erasable programmable read-only memory (EPROM) nonvolatile memory devices are not free to erase and write by the system itself, so it is not easy to update the contents of the memory. On the other hand, electrically erasable programmable read-only memory (EEPROM) nonvolatile memory devices are electrically erasable and writable, and may, thus, be readily applied to auxiliary memories or system programming memories that require continuous update.

SUMMARY

One embodiment is directed to provide an on-chip buffer program method for a data storage device which comprises a multi-bit memory device and a memory controller. The on-chip buffer program method comprises measuring a performance of the data storage device, judging whether the measured performance satisfies a target performance of the data storage device, and selecting one of a plurality of scheduling manners as an on-chip buffer program scheduling manner of the data storage device according to the judgment result.

In one embodiment, the multi-bit memory device comprises a memory cell array defined into a first region and a second region, the first region being formed of memory cells each designated to store 1-bit data and the second region being formed of memory cells each designated to store M-bit data (M being an integer of 3 or more).

In one embodiment, the on-chip buffer program scheduling manner includes a buffer program operation and a main program operation and the plurality of scheduling manners include a static scheduling manner, in which the buffer program operation and the main program operation are performed sequentially according to a given order, and a dynamic scheduling manner in which the buffer program operation is continuously carried out without execution of the main program operation, delayed main program operations of the dynamic scheduling manner being made after continuous execution of the buffer program operation.

In one embodiment, the main program operations delayed according to the dynamic scheduling manner are made after a predetermined period of time during which the buffer program operations are made continuously.

In one embodiment, the buffer program operation is triggered according to a control of the memory controller when data corresponding to a minimum program unit of the first region is stored in a buffer memory of the memory controller, the main program operation is triggered according to a control of the memory controller when data corresponding to a minimum program unit of the second region is stored in the first region, and the main program operation includes at least one of a 1-step program operation, a coarse program operation, or a fine program operation.

In one embodiment, the main program operation includes a single-bit read operation for reading data from the first region and a multi-bit program operation for storing data read from the first region in the second region, the single-bit read operation being iteratively made according to the main program operation.

In one embodiment, the performance of the data storage device is determined on the basis of the amount of data processed during a reference period of time.

In one embodiment, the target performance is a predetermined minimum throughput threshold, and if the measured performance is below the target performance of the data storage device, the dynamic scheduling manner is selected.

In one embodiment, if the measured performance is above the target performance of the data storage device, the static scheduling manner is selected.

Another embodiment is directed to a data storage device which comprises a multi-bit memory device having a memory cell array defined into a first region and a second region; and a memory controller having a buffer memory and configured to control the multi-bit memory device, wherein the memory controller controls the multi-bit memory device to perform a buffer program operation in which data stored in the buffer memory is stored in the first region and a main program operation in which data stored in the first region is stored in the second region; and wherein the memory controller changes an on-chip buffer program scheduling manner of the buffer and main program operations based upon a throughput of data processed during a reference period of time.

In one embodiment, the first region is formed of memory cells each designated for storing 1-bit data and the second region is formed of memory cells each designated for storing M-bit data (M being an integer of 3 or more).

In one embodiment, the on-chip buffer program scheduling manner includes a static scheduling manner in which the buffer program operation and the main program operation are performed sequentially according to a given order, and a dynamic scheduling manner in which the buffer program operation is continuously carried out without execution of the main program operation, main program operations being delayed a predetermined amount according to the dynamic scheduling manner and being made after continuous execution of the buffer program operation.

In one embodiment, the throughput of data is determined on the basis of the amount of data processed during the reference period of time and a performance of the data storage device is determined on the basis of the throughput of data. The dynamic scheduling manner is selected when the determined performance does not satisfy a target performance of the data storage device, and the static scheduling manner is selected when the determined performance satisfies the target performance of the data storage device.

In one embodiment, the main program operations delayed according to the dynamic scheduling manner are made after a predetermined period of time during which the buffer program operations are made continuously.

In one embodiment, the buffer program operation is triggered according to a control of the memory controller when data corresponding to a minimum program unit of the first region is stored in a buffer memory of the memory controller, the main program operation is triggered according to a control of the memory controller when data corresponding to a minimum program unit of the second region is stored in the first region, and the main program operation includes at least one of a 1-step program operation, a coarse program operation, or a fine program operation.

In another embodiment a method of programming in a data storage device includes: storing pages of data from a first buffer to a first memory cell region, thereby performing first programming stage operations; storing pages of data from the first memory cell region to a second memory cell region, thereby performing second programming stage operations; measuring a throughput performance of the data storage device; and based on the measured throughput performance, selecting a scheduling order for performing the first programming stage operations and the second programming stage operations.

BRIEF DESCRIPTION OF THE FIGURES

The above and other objects and features will become apparent from the following description with reference to the following figures, wherein like reference numerals refer to like parts throughout the various figures unless otherwise specified, and wherein FIG. 1A a diagram showing an example of an address scramble manner applied to a multi-level memory device according to an exemplary embodiment.

FIG. 2 is a block diagram showing a data storage system according to an exemplary embodiment.

FIG. 4 is a diagram showing an exemplary address scramble manner of a multi-bit memory device which stores 3-bit data per cell and to which a 3-step reprogram method is applied.

FIG. 10 is a diagram showing another exemplary address scramble manner of a multi-bit memory device in which 4-bit data is stored in a memory cell and a reprogram method is used.

DETAILED DESCRIPTION

Figure 1A:
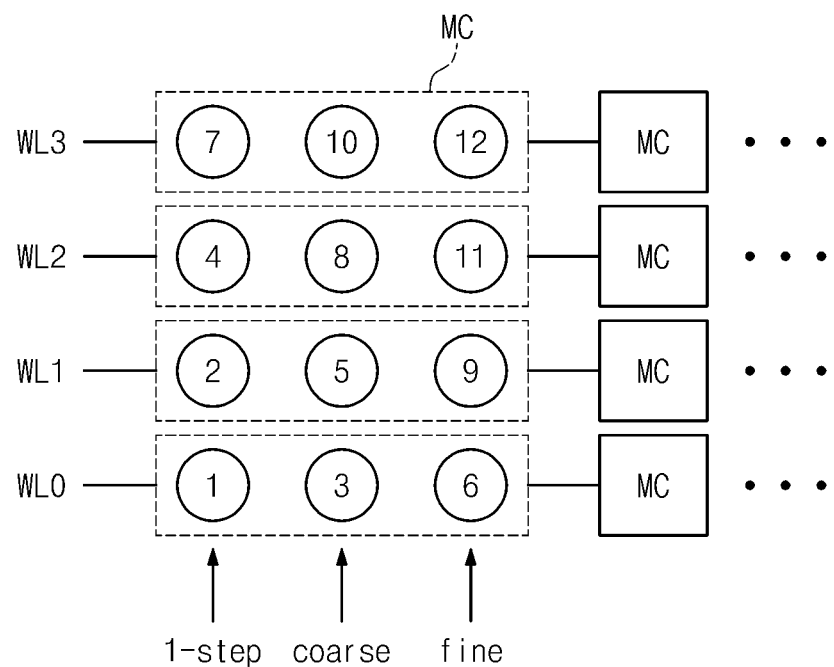
FIG. 1B is a diagram showing exemplary threshold voltage distributions varied when a program operation is carried out according to 3-step programming to store 4-bit data in each memory cell.
FIG. 1C is a diagram showing exemplary threshold voltage distributions varied when a program operation is carried out according to 3-step programming to store 3-bit data in each memory cell.

The disclosure is described more fully hereinafter with reference to the accompanying drawings, in which various embodiments are shown. This inventive concept may, however, be embodied in many different forms and should not be construed as limited to the embodiments set forth herein. In the drawings, the size and relative sizes of layers and regions may be exaggerated for clarity. Like numbers refer to like elements throughout. The terminology used herein is for the purpose of describing particular embodiments only and is not intended to be limiting of the inventive concept.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

With an increase in the number of data bits stored in each memory cell, it is increasingly difficult to secure the reliability of a memory device storing multi-bit (or, multi-level) data, which is called a multi-level memory device, hereinafter. A representative one of factors causing degradation of the reliability may be a variation of threshold voltages due to the coupling between adjacent memory cells. For example, a threshold voltage of a previously programmed memory cell may be varied due to the coupling caused when a memory cell adjacent to a programmed memory cell is programmed. In FIG. 1A, there is illustrated an example of an address scramble manner applied to a multi-level memory device in order to manage the coupling effectively.

An address scramble manner will be described under the assumption that 3-bit data is stored in one memory cell. For ease of illustration, in FIG. 1A, there are illustrated four word lines WL0 to WL3 of a memory device. A plurality of memory cells MC may be connected with each word line. For the memory device, there may be performed a 1-step program operation (i.e., a first program operation step) in which an initial number of bits of data, such as two bits of data (e.g., lower 2-bit data) are stored to each memory cell in the first word line WL0. That is, during the 1-step program operation, two pages of data may be stored in the memory cells connected with the first word line WL0. This may be represented by ① in FIG. 1A. Successively, the 1-step program operation may be made with respect to memory cells connected with the second word line WL1. This may be represented by ② in FIG. 1A. After the 1-step program operation is performed with respect to memory cells connected with the second word line WL1, a coarse program operation (or, called the second program operation step or 2-step program operation) may be made with respect to the first word line WL0 which is placed below the second word line WL1 and in which lower 2-bit data is programmed. This may be represented by ③. During the coarse program operation, a third bit of data (e.g., an upper 1-bit data) may be stored in memory cells connected with the first word line WL0. Following the coarse program operation of memory cells connected with the first word line WL0, the 1-step program operation may be made with respect to the third word line WL2. This may be represented by ④ After the 1-step program operation on the third word line WL2, the coarse program operation may be performed to store a third bit of data (e.g., an upper 1-bit data) in memory cells connected with the second word line WL1. This may be represented by ⑤. Following the coarse program operation on the second word line WL1, a fine program operation (third program operation step) may be made with respect to the first word line WL0. This may be represented by ⑥. Afterwards, the 1-step, coarse, and fine program operations may be performed sequentially according to the above-described program order (refer to FIG. 1A). A manner of selecting word lines according to the program order shown in FIG. 1A may be called an address scramble manner.

In an exemplary embodiment, an address scramble manner is described under the assumption that 3-bit data is stored in one memory cell. However, the inventive concept is not limited thereto. For example, a program operation performed when 4-bit data is stored in one memory cell may be similar to that executed when 3-bit data is stored in one memory cell except that two pages of data are stored during a 2-step program operation, and description thereof is thus omitted. In addition, the scramble order of programming the word lines need not follow the pattern described above. Other patterns that also do not follow the sequential order of the word lines can be used.

If the 1-step program operation and the coarse program operation are completed, all threshold voltage distributions (for example, $2^M$ threshold voltage distributions) corresponding to M-bit data (M being 2 or more integers) may be formed. Although all threshold voltage distributions are formed upon completion of the coarse program operation, margins between threshold voltage distributions may be insufficient to distinguish threshold voltage distributions exactly. The fine program operation may be carried out to secure margins sufficient to distinguish threshold voltage distributions exactly. The fine program operation may be performed to narrow a width of each threshold voltage distribution. During the fine program operation, verification voltages may be used which are higher by a predetermine voltage than verification voltages of threshold voltage distributions used at the coarse program operation. It is possible to reduce the effects of coupling between adjacent memory cells through the above-described program manner, which is also called a reprogram method or reprogram algorithm.

In an exemplary embodiment, the above-described 3-bit data reprogram method, that is, the 1-step programming, coarse programming, and fine programming, may be applied to a reprogram method of other data sizes, such as, for example, 2-bit data.

With the reprogram method, it may be necessary to retain data stored in memory cells in an arbitrary word line until there is completed the fine program operation for the arbitrary word line. For example, the 1-step program operation may be carried out depending upon data provided to a multi-bit memory device from a memory controller, and the coarse program operation may be made depending upon data stored through the 1-step program operation and data provided from the memory controller. The fine program operation may be made depending upon data stored through the 1-step and coarse program operations. But, as described above, it may be difficult to exactly read data stored through the 1-step and coarse program operations. This means that data necessary for the fine program operation should be provided to the multi-bit memory device from the memory controller. For this reason, the memory controller causes the retaining of data stored in memory cells in an arbitrary word line until there is completed the fine program operation for the arbitrary word line. As a result, a large buffer memory would need to be provided to the memory controller in order to retain data needed for the fine program operation.

FIG. 1B is a diagram showing threshold voltage distributions varied when a program operation is carried out according to three step programming to store 4-bit data in each memory cell. Below, a program method according to the three step programming will be more fully described with reference to accompanying drawings.

Firstly, 2-page data (e.g., the first and second pages of data, though other pages may be used) may be stored in memory cells of a selected word line (e.g., WL0 in FIG. 1A). At this time, as illustrated in a box 21 of FIG. 1B, memory cells in a threshold voltage distribution corresponding to an erase state E may be programmed to have threshold voltages in threshold voltage distributions each corresponding to program states Q1, Q2, and Q3, based on data to be programmed.

As described above, a coarse program operation of 1-step programmed memory cells in a word line (for example, WL0) may be executed after a 1-step program operation of memory cells in an adjacent word line (e.g., WL1). At this time, as illustrated in a box 22 of FIG. 1B, distributions of 1-step programmed memory cells in the word line (e.g., WL0) may widen due to the coupling caused when memory cells in an adjacent word line (e.g., WL1) are programmed.

Then, 2-page data, for example, the third and fourth pages of data may be stored in memory cells of the selected word line WL0. At this time, as illustrated in a box 23 of FIG. 1B, memory cells in a threshold voltage distribution corresponding to each state may be programmed to have threshold voltages in corresponding threshold voltage distributions. For example, memory cells in a threshold voltage distribution corresponding to an erase state E may be programmed to have threshold voltages in corresponding threshold voltage distributions to program states P1' to P3', based on data to be programmed. Memory cells in a threshold voltage distribution corresponding to a program state Q1 may be programmed to have threshold voltages in corresponding threshold voltage distributions to program states P4' to P7', based on data to be programmed. Memory cells in a threshold voltage distribution corresponding to a program state Q2 may be programmed to have threshold voltages in corresponding threshold voltage distributions to program states P8' to P11', based on data to be programmed. Memory cells in a threshold voltage distribution corresponding to a program state Q3 may be programmed to have threshold voltages in corresponding threshold voltage distributions to program states P12' to P15', based on data to be programmed.

As described above, a fine program operation of coarse programmed memory cells in a word line (e.g., WL0) may be made after a 1-step program operation and a coarse program operation on adjacent word lines (e.g., WL2 and WL1). At this time, as illustrated by a box 24 of FIG. 1B, distributions of coarse programmed memory cells in the word line (e.g., WL0) may widen due to the coupling caused when memory cells in adjacent word lines (e.g., WL2 and WL1) are programmed. For this reason, it may be difficult to exactly read data from coarse programmed memory cells when performing fine programming.

Memory cells in the word line WL0 may be programmed to have final threshold voltage distributions P1 to P15 as illustrated in a box 25 of FIG. 1B. This operation may be called a fine program operation. As described above, the fine program operation may need to use previously programmed data (e.g., the first to fourth pages of data). Since it may be difficult to read previously programmed data from memory cells in the word line WL0, the fine program operation may be made based on data provided from a memory controller (or, data separately maintained by a memory device). As illustrated in a box 26 of FIG. 1B, distributions of fine programmed memory cells may widen due to the coupling caused when memory cells in adjacent word lines are programmed.

Afterwards, a 1-step program operation, a coarse program operation, and a fine program operation on each word line will be made according to a program order (or, sequence) such as shown, for example, in FIG. 1A, which can be executed in the same manner as described in FIG. 1B.

Figure 1C:
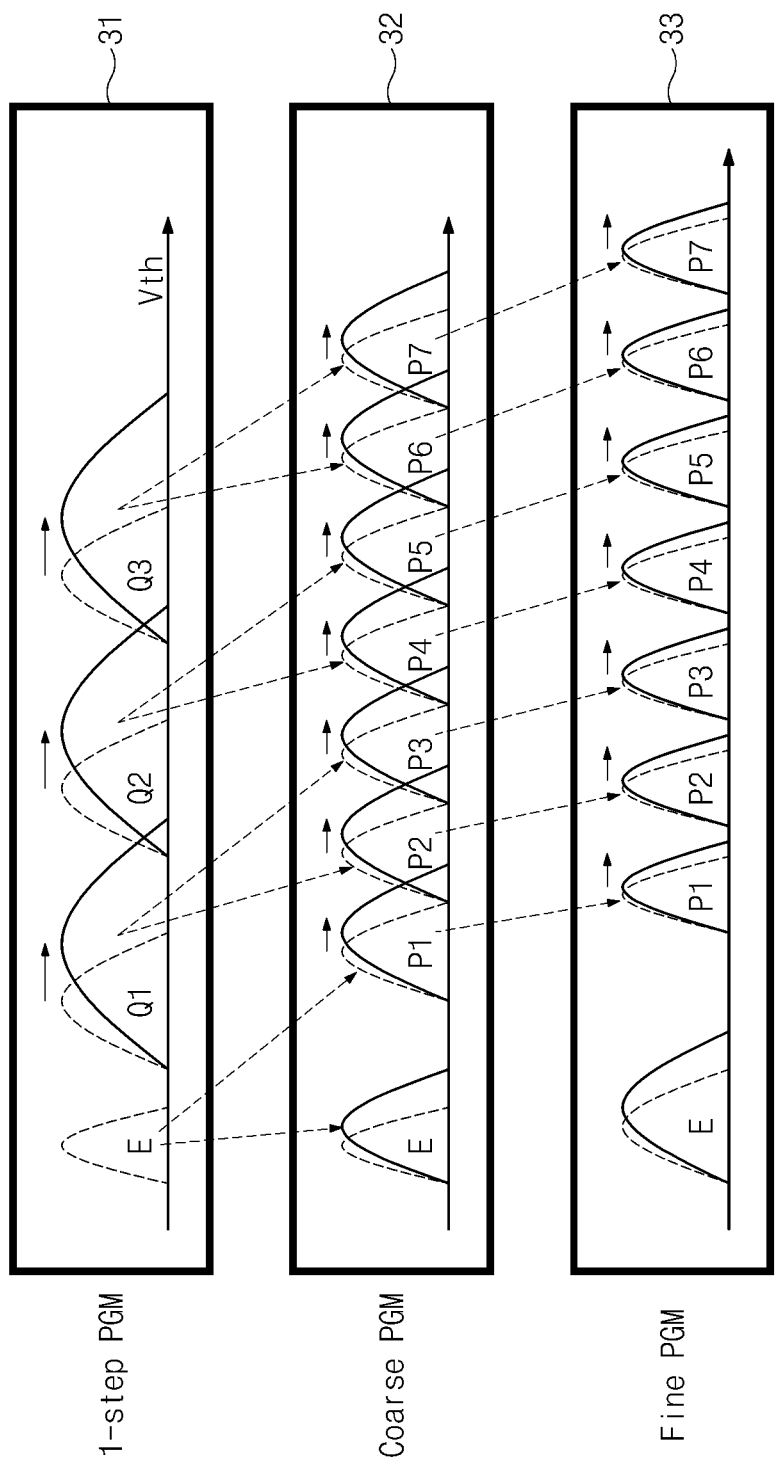

FIG. 1C is a diagram showing threshold voltage distributions varied when a program operation is carried out according to three step programming to store 3-bit data in each memory cell. Below, a program method according to the three step programming will be more fully described with reference to accompanying drawings.

First, 2-page data (e.g., the first and second pages of data, though other pages may be used) may be stored in memory cells of a selected word line (e.g., WL0 in FIG. 1A). At this time, as illustrated in a box 31 of FIG. 1C, memory cells in a threshold voltage distribution corresponding to an erase state E may be programmed to have threshold voltages in threshold voltage distributions each corresponding to program states Q1, Q2, and Q3, based on data to be programmed.

As described above, a coarse program operation of 1-step programmed memory cells in a word line (e.g., WL0) may be executed after a 1-step program operation of memory cells in an adjacent word line (e.g., WL1). At this time, as illustrated by a solid line of a box 31 of FIG. 1C, distributions of 1-step programmed memory cells in the word line (e.g., WL0) may widen due to the coupling caused when memory cells in an adjacent word line (e.g., WL1) are programmed.

Then, 1-page data may be stored in memory cells of the selected word line WL0. At this time, as illustrated in a box 32 of FIG. 1C, memory cells in a threshold voltage distribution corresponding to each state may be programmed to have threshold voltages in corresponding threshold voltage distributions. For example, memory cells in a threshold voltage distribution corresponding to an erase state E may be programmed to have threshold voltages in a corresponding threshold voltage distribution to a program state P1, based on data to be programmed. Memory cells in a threshold voltage distribution corresponding to a program state Q1 may be programmed to have threshold voltages in corresponding threshold voltage distributions to program states P2 and P3, based on data to be programmed. Memory cells in a threshold voltage distribution corresponding to a program state Q2 may be programmed to have threshold voltages in corresponding threshold voltage distributions to program states P4 and P5, based on data to be programmed. Memory cells in a threshold voltage distribution corresponding to a program state Q3 may be programmed to have threshold voltages in corresponding threshold voltage distributions to program states P6 to P7, based on data to be programmed.

As described above, a fine program operation of coarse programmed memory cells in a word line (e.g., WL0) may be made after a 1-step program operation and a coarse program operation on adjacent word lines (e.g., WL2 and WL1). At this time, as illustrated by a solid line in a box 32 of FIG. 1C, distributions of coarse programmed memory cells in the word line (for example, WL0) may widen due to the coupling caused when memory cells in adjacent word lines (for example, WL2 and WL1) are programmed. For this reason, it may be difficult to exactly read data from coarse programmed memory cells when performing fine programming.

Memory cells in the word line WL0 may be programmed to have final threshold voltage distributions P1 to P7 as illustrated in a box 33 of FIG. 1C. This operation may be called a fine program operation. As described above, the fine program operation may need to use previously programmed data (e.g., the first to third pages of data). Since it may be difficult to read previously programmed data from memory cells in the word line WL0, the fine program operation may be made based on data provided from a memory controller (or, data separately maintained by a memory device). As illustrated by a solid line in a box 33 of FIG. 1C, distributions of fine programmed memory cells may widen due to the coupling caused when memory cells in adjacent word lines are programmed.

Afterwards, a 1-step program operation, a coarse program operation, and a fine program operation on each word line will be made according to a program order (or, sequence) such as shown, for example, in FIG. 1A, which can be executed in the same manner as described in FIG. 1C.

FIG. 2 is a block diagram showing a data storage system according to an exemplary embodiment.

Referring to FIG. 2, a data storage system 1000 may include a multi-bit memory device 100 as a nonvolatile memory device, a memory controller 200, and a host 300. The multi-bit memory device 100 may be formed of one or more memory chips. As a data storage device 1100, the multi-bit memory device 100 and the memory controller 200 may constitute a memory card, a Solid State Drive (SSD), a memory stick, or the like. The multi-bit memory device 100 may include a plurality of memory blocks (or, sectors/banks), each of which has memory cells arranged in rows and columns. Each of the memory cells may store multi-bit (or, multi-level) data. The memory cells are arranged to have the 2-dimensional array structure or the 3-dimensional/vertical array structure. An exemplary 3-dimensional array structure is disclosed in U.S. Pat. Nos. 7,812,390 and 7,646,664, and U.S. Patent Publication Nos. 2008/0023747 and 2008/0084729, the entirety of which are incorporated by reference herein.

Memory blocks of the multi-bit memory device 100 may be divided into at least two regions, that is, the first region 101 and the second region 102. Herein, it is well understood that division of the first and second regions 101 and 102 is made logically, not necessarily physically. Division of the first and second regions 101 and 102 can be changed logically. In the event that the multi-bit memory device 100 is formed of a plurality of chips or a plurality of physical regions on one or more chips, two regions can be divided physically. Memory blocks in the first region 101 may be programmed in a manner different from memory blocks in the second region 102. For example, memory blocks in the first region 101 may be programmed according to a single-bit program manner (hereinafter, referred to as an SLC program manner), and memory blocks in the second region 102 may be programmed according to a multi-bit program manner (e.g., a manner including the steps in the above-described multi-step reprogram manner) (hereinafter, referred to as an MLC program manner). In other words, each memory cell in the first region 101 may be designated to store and may store 1-bit data, while each memory cell in the second region 102 may be designated to store and may store M-bit data (M being an integer of 2 or more). Further, each memory cell in the first region 101 may store less data bits in number as compared with M-bit data (M being an integer of 2 or more) stored in each memory cell in the second region 102.

Continuing to refer to FIG. 2, the memory controller 200 may be configured to control the multi-bit memory device 100 in response to a request of the host 300. The memory controller 200 may include a buffer memory 201. The buffer memory 201 may be used to temporarily store data sent from the host 300 and data read out from the multi-bit memory device 100. The memory controller 200 may control a program operation of the multi-bit memory device 100 in a static scheduling manner and a dynamic scheduling manner. Switching between the static and dynamic scheduling manners may be made in real time. For example, the switching between the static and dynamic scheduling manners may be made in real time according to the performance of the data storage device 1100. For example, the performance of the data storage device 1100 may be determined in real time according to a data throughput/bandwidth. However, it is well understood that the performance of the data storage device 1100 is not limited to this disclosure.

The memory controller 200 may be configured to measure the performance of the data storage device 1100. For example, the performance of the data storage device 1100 may be measured/determined using an average value of the amount of data processed during a given time (or, a reference time). The memory controller 200 may select one of the dynamic and static scheduling manners based upon the measured performance and may control the multi-bit memory device 100 according to the selected scheduling manner. The data processing performance can be managed efficiently by switching a scheduling manner in real time.

With the static scheduling manner, for example, if data of the minimum program unit of the first region 101 is stored in the buffer memory 201, the memory controller 200 may control the multi-bit memory device 100 such that data of the minimum program unit is stored (or, programmed) in the first region 101. This may be called a buffer program operation (BP). If data of the minimum program unit of the second region 102 is gathered at the first region 101, the memory controller 200 may control the multi-bit memory device 100 such that data of the minimum program unit of the second region 102 is stored (or, programmed) in the second region 102. This may be called a main program operation (MP). The buffer program operation and the main program operation may form an on-chip buffer program (OBP) operation, which will be more fully described below.

With the dynamic scheduling manner, the buffer program operation may be performed continuously without execution of the main program operation. That is, unlike the static scheduling manner, if the dynamic scheduling manner is selected, the buffer program operation on the first region 101 may be continuously performed without the main program operation on the second region 102 for a predetermined period of time. The length of time that the main program operation on the second region 102 is delayed (i.e., the predetermined period of time) may be selected in different manners and to have different amounts considering various limitations of the memory controller 200. For example, a delay time of the main program operation may be determined considering various limitations (e.g., a capacity of the first region 101, the target performance, etc.) and may be set internally and/or automatically, or based on operator or user input.

As such, the different scheduling manners differ in the way in which a main program operation is triggered. In static scheduling, for example, a main program operation may be triggered in response to a particular page of data for a particular word line (e.g., destined for a particular address) being stored in the first region 101, whereas in dynamic scheduling, a main program operation may be triggered in response to a timer, a number of pages of data stored in first region 101, or other factors.

In an exemplary embodiment, the minimum program unit of the first region 101 and the minimum program unit of the second region 102 may be determined variously depending upon a program manner, a cell-per-bit number, and the like. The minimum program unit for the first region 101 may be different from the minimum program unit for the second region 102.

In an exemplary embodiment, it is possible to minimize a size of the buffer memory 201 of the memory controller 200 by storing data in the first region 101 through the buffer program operation and storing data in the second region 102 through the main program operation. For example, it may be unnecessary to retain data for a fine program operation in the buffer memory 201. Accordingly, a size of the buffer memory 201 of the memory controller 200 may be made smaller. Further, it is possible to switch a scheduling manner into the dynamic scheduling manner or the static scheduling manner in real time according to the performance of the data storage device 1100.

Figure 3:
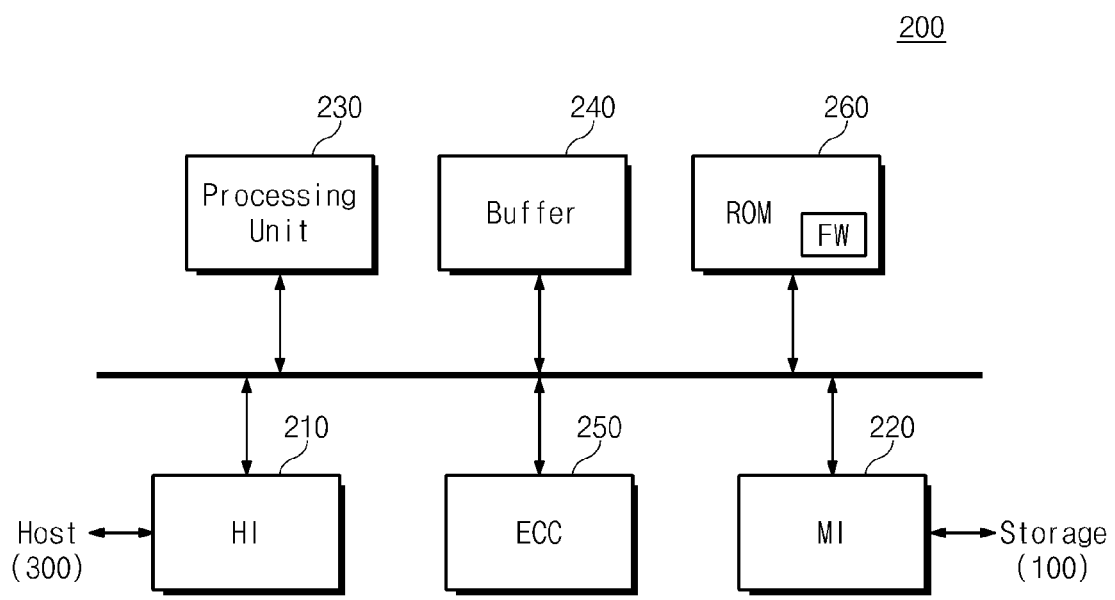
FIG. 3 is a block diagram showing a memory controller in FIG. 2, according to an exemplary embodiment.

FIG. 3 is a block diagram showing a memory controller in FIG. 2 according to an exemplary embodiment.

Referring to FIG. 3, a memory controller 200 may include a host interface 210, a memory interface 220, a processing unit 230 such as CPU or microprocessor, a buffer memory 240, an error control unit 250, and ROM 260.

The host interface 120 may be configured to interface with a host 300 in FIG. 2, and the memory interface 220 may be configured to interface with the multi-bit memory device 100 in FIG. 2. The processing unit 230 may be configured to control an overall operation of the memory controller 200. For example, the processing unit 230 may be configured to operate firmware such as Flash Translation Layer (FTL) stored in the ROM 260. Further, the processing unit 230 may be configured to drive firmware (FW) for performance monitoring stored in the ROM 260. The processing unit 230 may select one of scheduling manners according to the measured performance. The scheduling manners (i.e., static and dynamic scheduling manners) may be switched in real time according to the measured performance.

In an exemplary embodiment, the FTL function and the performance monitoring function can be made using independent software, respectively. Alternatively, the FTL function and the performance monitoring function can be made using software in common. However, the disclosed embodiments are not limited thereto.

The buffer memory 240 may be used to temporarily store data to be transferred to the host 300 via the host interface 210. The buffer memory 240 may be used to temporarily store data to be written in the multi-bit memory device 100 via the memory interface 220. The ECC unit 250 may be configured to encode data to be stored in the multi-bit memory device 100 and to decode data read from the multi-bit memory device 100. The ECC unit 250 can be provided within the multi-bit memory device 100. In this case, data encoding and decoding may be made within the multi-bit memory device 100 without transferring of data to the memory controller 200.

In an exemplary embodiment, the firmware can be stored in the multi-bit memory device 100 instead of the ROM 260.

In an exemplary embodiment, the host interface 210 may include the protocol for performing data exchange between the host 300 and the memory controller 200. For example, the host interface 210 may be configured to communicate with the host 300 via at least one of various interface protocols such as USB (Universal Serial Bus) protocol, MMC (multimedia card) protocol, PCI (peripheral component interconnection) protocol, PCI-E (PCI-express) protocol, ATA (Advanced Technology Attachment) protocol, Serial-ATA protocol, Parallel-ATA protocol, SCSI (small computer small interface) protocol, ESDI (enhanced small disk interface) protocol, IDE (Integrated Drive Electronics) protocol, and the like.

Figure 5:
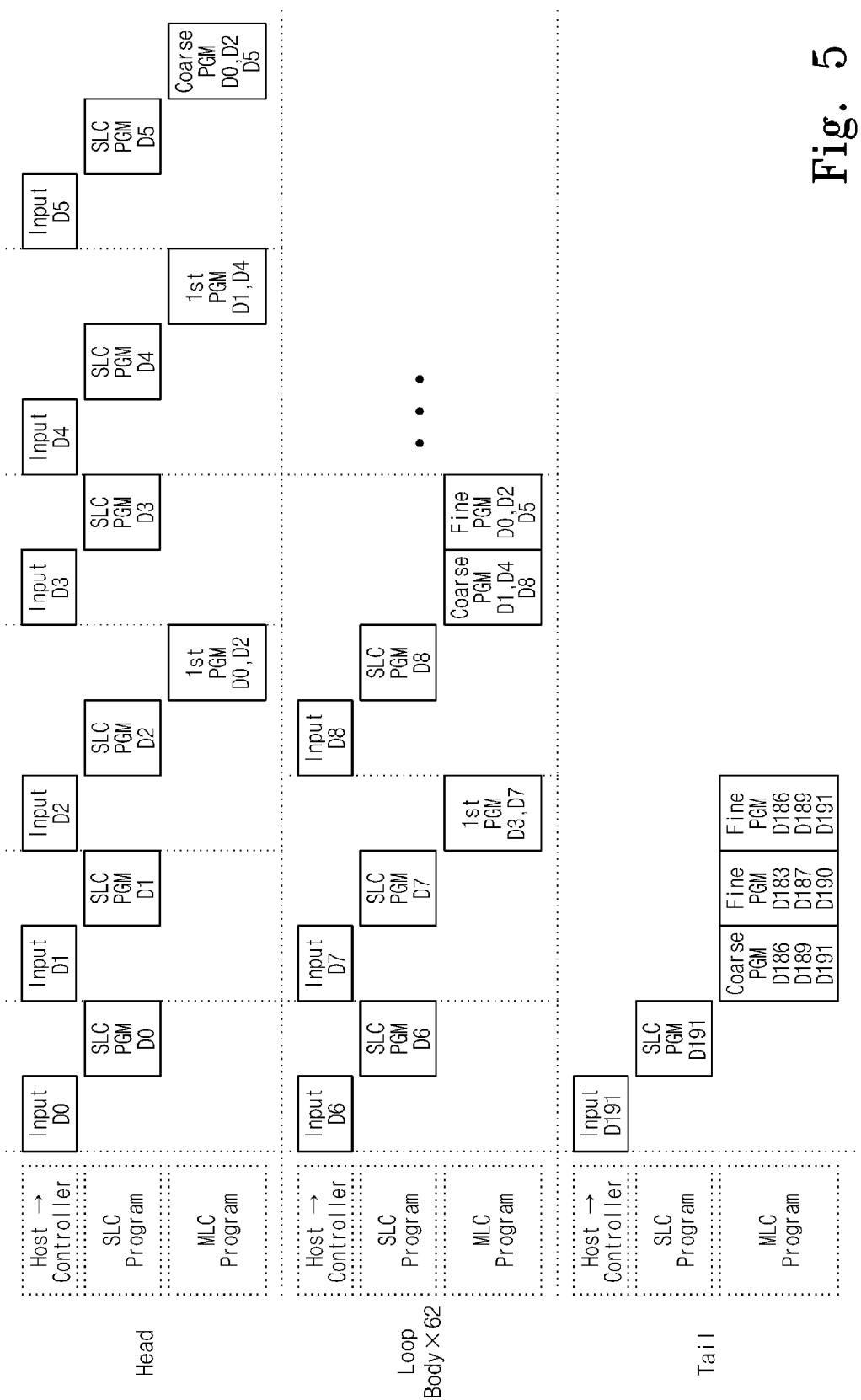
FIG. 5 is a diagram showing exemplary data flow during a program operation of a data storage system illustrated in FIG. 4.

FIG. 4 is a diagram showing an exemplary address scramble manner of a multi-bit memory device which stores 3-bit data per cell and to which a three-step reprogram method is applied, and FIG. 5 is a diagram showing data flow during a program operation of a data storage system illustrated in FIG. 4. Below, an operation of a data storage system according to an exemplary embodiment will be more fully described with reference to accompanying drawings.

In order to simplify the description, as illustrated in FIG. 4, it is assumed that each memory block includes 64 word lines WL0 to WL63 and that each memory cell stores 3-bit data. With this assumption, 192 pages are stored in each memory block.

First, if data D0 of the minimum program unit of the first region 101 is transferred to a buffer memory 201 of a memory controller 200 from a host 300, the data D0 stored in the buffer memory 201 may be programmed in the first region 101 of a multi-bit memory device 100 according to the control of the memory controller 200. As described above, the data D0 may be programmed in the first region 101 through an SLC program operation. This may be called a buffer program operation as described above. The memory controller 200 may judge whether data of the minimum program unit of the second region 102 is gathered at the first region 101, and may control a main program operation according to the judgment result. Whether data of the minimum program unit of the second region 102 is gathered at the first region 101 may be judged, for example, according to a page address. Since only one page D0 is stored in the first region 101, the main program operation may not be carried out. If data D1 of the minimum program unit of the first region 101 is transferred to the buffer memory 201 of the memory controller 200 from the host 300, the data D1 stored in the buffer memory 201 may be programmed in the first region 101 of the multi-bit memory device 100 according to the control of the memory controller 200.

If data D2 of the minimum program unit of the first region 101 is transferred to the buffer memory 201 of the memory controller 200 from the host 300, the data D2 stored in the buffer memory 201 may be programmed in the first region 101 of the multi-bit memory device 100 according to the control of the memory controller 200. Since data of the minimum program unit of the second region 102 (for example, two pages of data necessary for a 1-step program operation) is gathered at the first region 101, the memory controller 200 may next control the multi-bit memory device 100 such that data D0 and D2 stored in the first region 101 is stored in the second region 102. That is, the 1-step program operation on a word line WL0 may be made based on the data D0 and D2 stored in the first region 101. The 1-step program operation may include reading data D0 from the first region 101 via a page buffer, reading data D2 from the first region 101 via the page buffer, and storing the data D0 and D2 read via the page buffer in the second region 102. An error correction operation can be performed with respect to data read during the 1-step program operation. This may be accomplished by transferring data read from the first region 101 to the memory controller 200 and loading data corrected by the memory controller 200 onto the page buffer. The error correction operation may be made whenever data is read out from the first region 101.

If data D3 of the minimum program unit of the first region 101 is transferred to the buffer memory 201 of the memory controller 200 from the host 300, the data D3 stored in the buffer memory 201 may be programmed in the first region 101 of the multi-bit memory device 100 according to the control of the memory controller 200. If data D4 of the minimum program unit of the first region 101 is transferred to the buffer memory 201 of the memory controller 200 from the host 300, the data D4 stored in the buffer memory 201 may be programmed in the first region 101 of the multi-bit memory device 100 according to the control of the memory controller 200. Since data of the minimum program unit of the second region 102 (for example, two pages of data necessary for the 1-step program operation) is gathered at the first region 101, the memory controller 200 may control the multi-bit memory device 100 such that data D1 and D4 stored in the first region 101 is stored in the second region 102. That is, the 1-step program operation on a word line WL1 may be performed based on the data D1 and D4 stored in the first region 101.

As described above, if data of the minimum program unit of the first region 101 is stored in the buffer memory 201, data stored in the buffer memory 201 may be programmed in the first region 101 of the multi-bit memory device 100 under the control of the memory controller 200. Data may be stored in the first region 101 through the SLC program operation. If data Di (i being 0 to 191) of the minimum program unit of the first region 101 is stored in the buffer memory 201, as described in FIG. 5, data stored in the buffer memory 201 may be programmed in the first region 101 of the multi-bit memory device 100 through the SLC program operation under the control of the memory controller 200. Together with judgment of whether data of the minimum program unit for the first region 101 is stored in the buffer memory 201, the memory controller 200 may judge whether data of the minimum program unit on the second region 102 is gathered at the first region 101. The memory controller 200 may control the 1-step program operation, the coarse program operation, or the fine program operation on the second region 102, depending upon the judgment result, which will be more fully described below.

The 1-step program operation, the coarse program operation, or the fine program operation on the second region 102 may be determined in an address scramble manner illustrated in FIG. 4. For example, in the event that D0 and D2 data are stored in the first region 101, the 1-step program operation on a word line WL0 may be carried out depending upon the D0 and D2 data stored in the first region 101. If D1 and D4 data are stored in the first region 101, the 1-step program operation on a word line WL1 may be carried out. That is, the 1-step program operation on the word line WL1 may be carried out depending upon the D1 and D4 data stored in the first region 101.

Subsequently, if D5 data is stored in the first region 101, the coarse program operation on the word line WL0 may be carried out depending upon the D0, D2, and D5 data stored in the first region 101. When D3 and D7 data are stored in the first region 101, the 1-step program operation on the word line WL2 may be made depending upon the D3 and D7 data stored in the first region 101. In the event that D8 data is stored in the first region 101, the coarse program operation on the word line WL1 may be carried out depending upon the D1, D4, and D8 data stored in the first region 101. After the coarse program operation on the word line WL1 is carried out depending upon the D1, D4, and D8 data stored in the first region 101, the fine program operation on the word line WL0 may be made depending on D0, D2, and D5 data stored in the first region 101. Afterwards, until D191 data is stored in the first region 101, the remaining data D10 to D190 may be stored in the second region 102 in the same order as the 1-step program operation of the D3 and D7 data, the coarse program operation of the D1, D4 and D8 data, and the fine program operation of the D0, D2, and D5 data.

In the case that D191 data is stored in the first region 101, the coarse program operation on the word line WL63 may be carried out depending upon D186, D189, and D191 data stored in the first region 101. After the coarse program operation on the word line WL63 is carried out depending upon D186, D189, and D191 data stored in the first region 101, the fine program operation on the word line WL62 may be made depending upon D183, D187, and D190 data stored in the first region 101. Finally, the fine program operation on the word line WL63 may be made depending upon D186, D189, and D191 data stored in the first region 101.

As understood from FIG. 5, it is possible to judge an SLC program operation (e.g., the first program pattern), a set of SLC and 1-step program operations (e.g., the second program pattern), a set of SLC and coarse program operations (e.g., the third program pattern), a set of SLC, coarse, and fine program operations (e.g., the fourth program pattern), and a set of SLC, coarse, fine, and fine program operations (e.g., the fifth program pattern), depending upon data to be stored in the first region 101, such as a page address of data to be stored in the first region 101. The SLC program operation, the 1-step program operation, the coarse program operation, or the fine program operation, for example, may be carried out when corresponding commands are provided to the multi-bit memory device 100 from the memory controller 200. Alternatively, a command set indicating a program pattern may be provided to the multi-bit memory device 100, and the multi-bit memory device 100 may perform a set of operations automatically according to the command set. The program pattern may be formed of an SLC program operation, a set of SLC and 1-step program operations, a set of SLC and coarse program operations, a set of SLC, coarse, and fine program operations, or a set of SLC, coarse, fine, and fine program operations. A set of program operations in a program pattern may be changed according to an address scramble manner, a cell-per-bit number, and the like.

In certain embodiments, an address scramble manner of the multi-bit memory device 100 is not limited to that illustrated in FIG. 4.

The on-chip buffer program operation described in FIGS. 4 and 5 may correspond to a static scheduling manner. For example, the main program operation may be made whenever data of the minimum program unit on the second region 102 is gathered in the first region 101. As described above, the main program operation delayed during continuous execution of the buffer program operation may be delayed during a predetermined time. For example, the delayed main program operation may be made after a predetermined time. This on-chip buffer program operation may correspond to a dynamic scheduling manner. Below, the dynamic and static scheduling manners will be more fully described.

Figure 6:
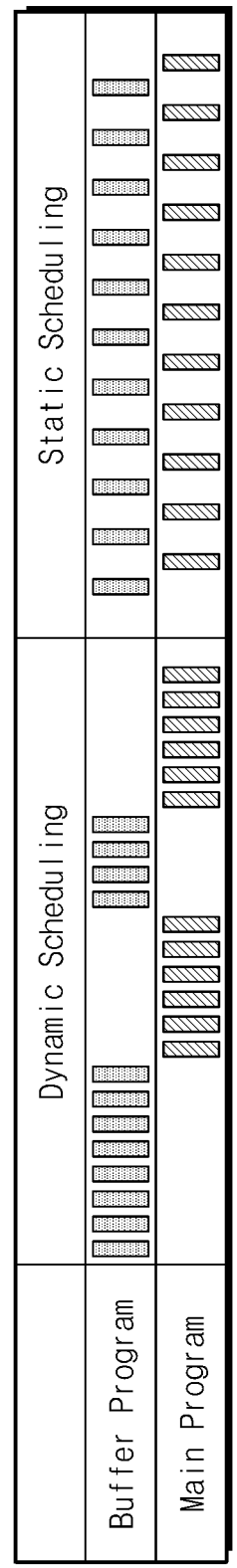
FIG. 6 is a diagram for describing static and dynamic scheduling manners applied to a data storage device according to an exemplary embodiment.

FIG. 6 is a diagram for describing static and dynamic scheduling manners applied to a data storage device according to an exemplary embodiment.

An on-chip buffer program operation according to an exemplary embodiment may include a buffer program operation and a main program operation. The buffer program operation may be made to store data (e.g., 1-page data) stored in a buffer memory 201 in the first region 101 of a multi-bit memory device 100. The main program operation may be made to store data (e.g., 2-page data at 1-step programming or 3-page data at coarse or fine programming) stored in the first region 101 of the multi-bit memory device 100 in the second region 102 of the multi-bit memory device 100.

In case of the dynamic scheduling manner, as illustrated in FIG. 6, the buffer program operation may be made continuously during a predetermined time. The main program operation on data stored in the first region 101 via the continuous buffer program operations may be delayed. The buffer program operation may be made without execution of the main program operation interspersed between buffer program operation steps, for a certain period of time. If the on-chip buffer program operation is made according to the dynamic scheduling manner, the program performance may be maximized at the buffer program operation, while it (or, the performance of a data storage device 1100) may be deteriorated at the main program operation. In the event that the on-chip buffer program operation is made using the dynamic scheduling manner, the first region 101 should be configured to have a larger capacity.

In case of the static scheduling manner, as illustrated in FIG. 6, the buffer program operation may be made when data of the minimum program unit of the first region 101 is stored in the buffer memory 201. The main program operation may be carried out when data of the minimum program unit of the second region 102 is gathered in the first region 101. Unlike the dynamic scheduling manner, a delay of the main program operation may not be generated. In the event that the on-chip buffer program operation is made using the static scheduling manner, the first region 101 may be configured to have a smaller capacity.

As discussed above, programming of the word lines includes multiple programming steps that may follow a scramble manner. From among those multiple steps, a plurality of those steps may correspond to programming stages for a particular word line. For example, a first programming stage for a first word line may include one or more SLC program operations (e.g., buffer program operations), for example, where individual pages are stored in a first region 101). A second programming stage for that word line may include one or more MLC program operations (e.g., main program operations), where one or more pages of data stored in the first region 101 are programmed to the second region 102. The second programming stage may include sub-stages. For example, a first sub-stage may include the 1-step program operation described previously, where, for example, two pages of data stored in first region 101 are programmed to a word line of second region 102. A second sub-stage may include a coarse programming operation, where, for example, one or more additional pages of data stored in first region 101 are programmed to a word line of second region 102 that has already undergone the first sub-stage of programming. An additional programming sub-stage may include fine programming.

In embodiment in which a static scheduling manner is used, for each word line to be programmed, second programming stage operations are triggered by the completion of particular first programming stage operations. For example, in one embodiment, as soon as a sufficient number of pages are stored in the first region 101 as a result of first programming stage operations to satisfy a minimum page requirement for programming to the second region, the next programming step carried out for the memory device is a second stage programming operation for that word line. For example, for a 3-bit memory device as described above, as soon as two pages for a word line are stored in the first region, the subsequent programming step for the memory device can include performing a first sub-stage programming including 1-step programming of the two pages to the second region 102. In addition, after the 1-step programming has occurred, as soon as a third page for the word line is later stored in the first region, the subsequent programming step for the memory device can include performing a second sub-stage programming including coarse programming using the first two pages and the third page.

In one embodiment in which a dynamic scheduling manner is used, for each particular word line to be programmed, second programming stage operations are triggered based on a timer or other measurement. For example, in one embodiment, when a sufficient number of pages are stored in the first region 101 as a result of first programming stage operations to satisfy a minimum page requirement for programming to the second region in a second stage operation, the next programming step carried out for the memory device is not necessarily a second stage programming operation for that word line. Instead, the next programming step could include storing additional pages into the first region, for example, for other word lines and also for the particular word line. A second stage programming step or steps may occur instead after a particular period of time, after a particular amount of memory cells/word lines in the first region 101 have been filled, or based on some other criteria that is independent of a minimum page size of the second region 102. After the criteria is reached (e.g., a predetermined period of time), then the next series of programming steps are second stage programming operations, such as the 1-step operations, coarse programming operations, and fine programming operations.

For dynamic scheduling, a second criteria (e.g., a second period of time, a threshold number of word lines in the first region 101 available to be programmed, etc.) may be used to determine when to continue the first stage programming steps again. This cycle of first stage programming and second stage programming may then repeat in a continuous manner.

The dynamic scheduling manner may be suitable to improve the performance (e.g., the program performance), and the static scheduling manner may be suitable to maintain an average program performance. Accordingly, it is possible to manage the performance of the data storage device 1100 effectively by using the above-described dynamic and static scheduling manners selectively according to the performance of the data storage device 1100.

Figure 7:
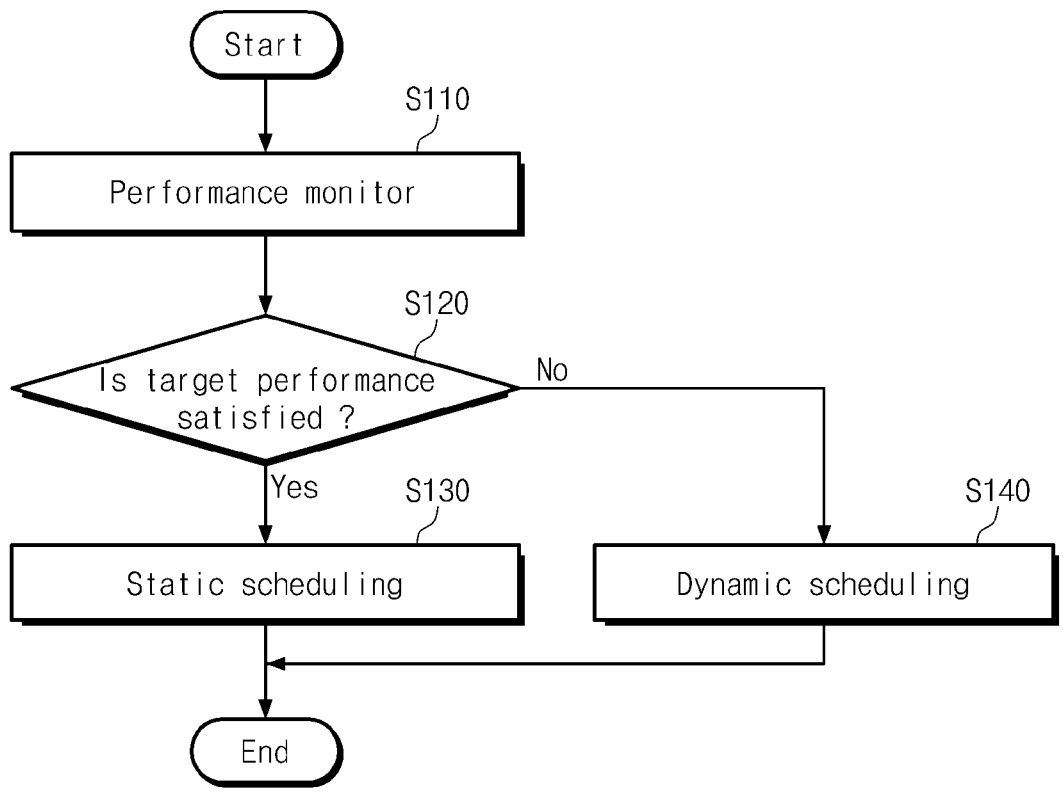
FIG. 7 is a flowchart for describing a performance-aware scheduling method of a data storage device according to an exemplary embodiment.

FIG. 7 is a flowchart for describing a performance-aware scheduling method of a data storage device according to an exemplary embodiment. Below, a performance-aware scheduling method of a data storage device according to an exemplary embodiment will be more fully described with reference to accompanying drawings.

Referring to FIG. 7, in step S110, the performance of a data storage device 1100 may be measured. Measuring of the performance may be made, for example, based upon the amount of data processed during a given time. The amount of data processed during a given time may be referred to as 'data throughput'. In operation S120, whether the data throughput satisfies the target performance may be judged.

If the data throughput is judged to satisfy the target performance, in operation S130, a static scheduling manner may be selected as a scheduling manner. When the static scheduling manner is selected, a buffer program operation may be performed as soon as data of the minimum program unit of the first region 101 for a particular word line is stored in a buffer memory 201, and a main program operation may be carried out as soon as data of the minimum program unit of the second region 102 for a particular word line is gathered in the first region 101.

If the data throughput is judged not to satisfy the target performance, in operation S140, a dynamic scheduling manner may be selected as the scheduling manner. When the dynamic scheduling manner is selected, the buffer program operation may be carried out for a continuous period of time. In this case, the main program operation on data stored in the first region 101 via the buffer program operation may be delayed. The buffer program operation may be performed alone, without being interrupted by execution of the main program operation. The delayed main program operations may be made by a memory controller 200 considering various limitations.

In an exemplary embodiment, a scheduling switching operation described in FIG. 7, such as a step for determining whether target performance is satisfied, may be made periodically, at regular intervals.

Figure 8:
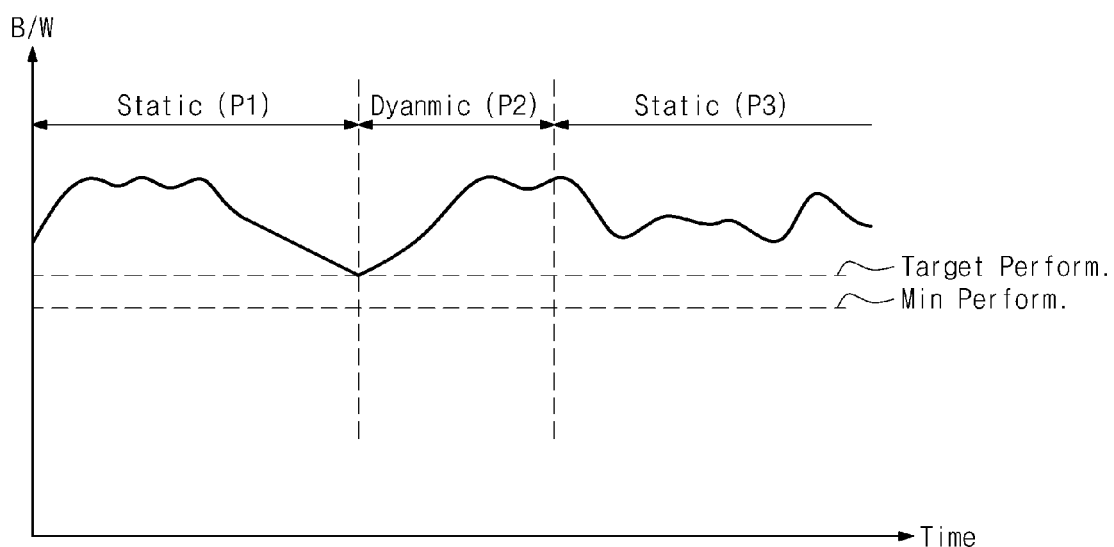
FIG. 8 is a diagram for describing a performance-aware scheduling manner of a data storage device according to an exemplary embodiment.

FIG. 8 is a diagram for describing a performance-aware scheduling manner of a data storage device according to an exemplary embodiment. In FIG. 8, a horizontal axis indicates a time, and a vertical axis indicates a bandwidth.

The performance of a data storage device 1100 may be measured using a bandwidth (or, data throughput), for example. The data storage device 1100 may have a maximum bandwidth. In one embodiment, the target performance of the data storage device 1100 may be set to a target bandwidth that is a certain bandwidth margin higher than a minimum desired bandwidth allowable. The minimum desired bandwidth and target bandwidths may be set at the manufacturing stage or dynamically during operation, either automatically by the device 1100 or manually by a user or operator. The minimum desired bandwidth may be set, for example, to an amount below which customer satisfaction with the product will be affected, which may be based on certain industry standards or other factors. In one embodiment, an exemplary minimum desired bandwidth is set at 6 MB/s, and a target bandwidth is set at 6.5 MB/s higher than the minimum desired bandwidth. However, the bandwidth for measuring the performance of the data storage device 1100 is not limited to these examples. For example, the target performance (i.e., target threshold bandwidth) of the data storage device 1100 can be set close to or at a maximum bandwidth of the device 1100.

As illustrated in FIG. 8, the performance (or, bandwidth) of the data storage device 1100 may vary as time goes by. In case of the first period P1 where the data throughput satisfies the target performance, an on-chip buffer program operation may be performed using a static scheduling manner. The data throughput may be reduced when the on-chip buffer program operation is carried out using the static scheduling manner. If the data throughput is judged not to satisfy the target performance, the on-chip buffer program operation may be switched to be performed using a dynamic scheduling manner. In this case, since the main program operation is delayed, the data throughput may increase. In one embodiment, the dynamic scheduling manner is used until the data throughput increases by a certain amount via the dynamic scheduling manner (e.g., above the target performance threshold, or to an upper threshold above the target performance threshold), at which point the on-chip buffer program operation may be again switched so that it is performed via the static scheduling manner. Afterwards, switching of the scheduling manner may be made in real time on the basis of the data throughput.

In an exemplary embodiment, the data throughput may indicate an average amount of data processed during a predetermined period of time. For example, after data input at a write request of a host 300 is stored in a multi-bit memory device 100, the data storage device 1100 may send a response to the write request to the host 300. At this time, it is possible to calculate a single data point of data throughput based upon a time between the write request and the response and the amount of write-requested data. An average value of data throughputs on write requests made during a predetermined period of time may be used to judge whether the data throughput satisfies the target performance.

FIGS. 9A to 9D are diagrams for describing various combinations on the first and second regions of a multi-bit memory device according to various exemplary embodiments. In the figures, 'BP' may indicate buffer programming on the first region 101, and 'MP' may indicate main programming on the second region 102.

As described above, a multi-bit memory device 100 may include the first region 101 and the second region 102. Herein, the first and second regions 101 and 102 may constitute a memory cell array of the multi-bit memory device 100. Although not illustrated in the figures, the memory cell array may include further regions such as a metadata region, a reserved region, and the like. It is well understood that regions of the memory cell array are divided logically, not necessarily physically. This means that such regions of the memory cell array are defined according to address mapping of a memory controller 200.

Figure 9A:
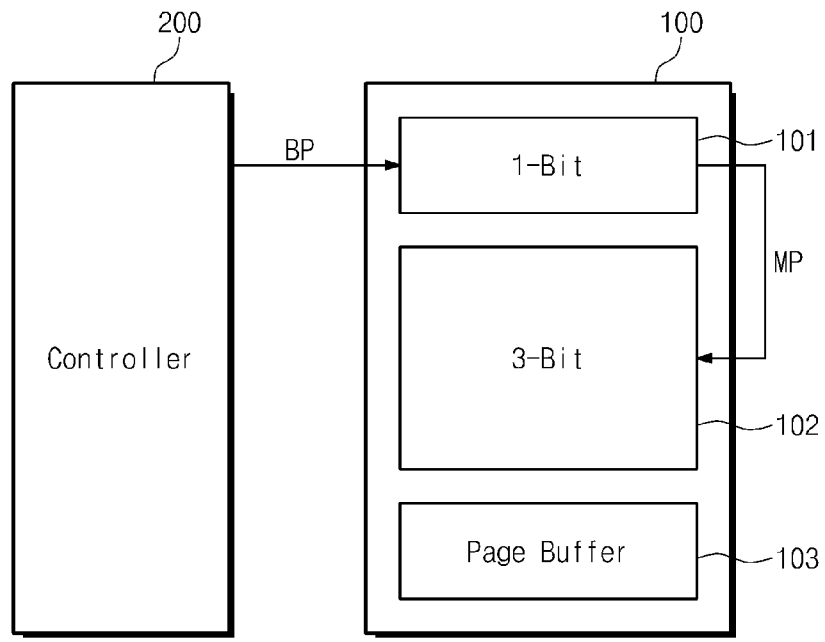
FIGS. 9A to 9D are diagrams for describing various combinations on the first and second regions of a multi-bit memory device according to exemplary embodiments.

Referring to FIG. 9A, in case of a multi-bit memory device which stores 3-bit data per cell, the first region 101 may be formed of memory cells each storing 1-bit data, and the second region 102 may be formed of memory cells each storing 3-bit data. In this case, the buffer programming may be executed according to an SLC program manner, and the main programming may be made according to the above-described MLC program manner.

Figure 9B:
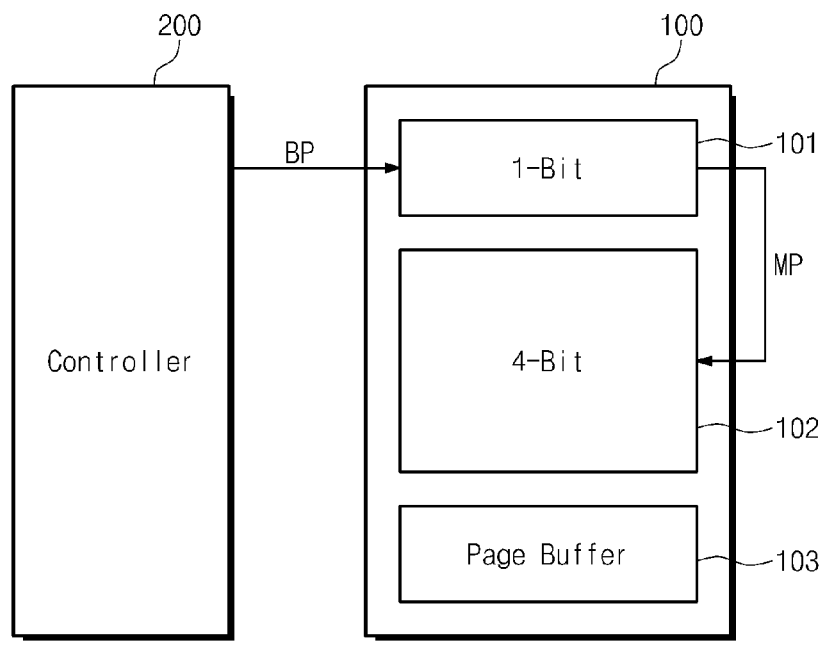

Referring to FIG. 9B, in case of a multi-bit memory device which stores 4-bit data per cell, the first region 101 may be formed of memory cells each storing 1-bit data, and the second region 102 may be formed of memory cells each storing 4-bit data. In this case, the buffer programming may be executed according to an SLC program manner, and the main programming may be made according to the above-described MLC program manner.

Figure 9C:
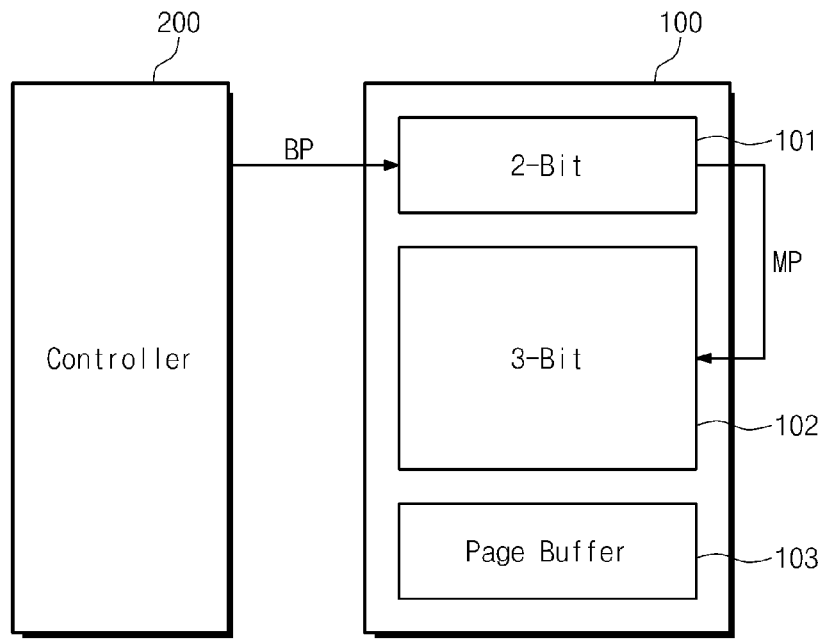

Referring to FIG. 9C, in case of a multi-bit memory device which stores 3-bit data per cell, the first region 101 may be formed of memory cells each storing 2-bit data, and the second region 102 may be formed of memory cells each storing 3-bit data. In this case, the buffer programming may be executed according to the above-described or conventional MLC program manner, and the main programming may be made according to the above-described MLC program manner (for example, a reprogram manner).

Figure 9D:
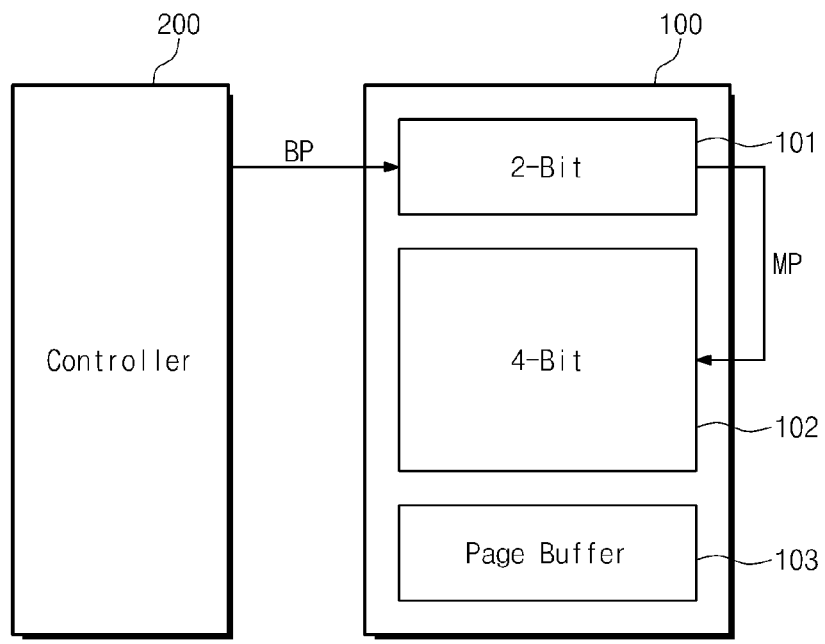

Referring to FIG. 9D, in case of a multi-bit memory device which stores 4-bit data per cell, the first region 101 may be formed of memory cells each storing 2-bit data, and the second region 102 may be formed of memory cells each storing 4-bit data. In this case, the buffer programming may be executed according to the above-described or conventional MLC program manner, and the main programming may be made according to the above-described MLC program manner (for example, a reprogram manner).

In an exemplary embodiment, it is well understood that defining of the first and second regions 101 and 102 illustrated in FIGS. 9A to 9D is not limited to this disclosure. For example, if a storage medium included in a data storage device is formed of a plurality of multi-bit memory devices, the first and second regions 101 and 102 can be defined with respect to the respective multi-bit memory devices. Alternatively, the first region 101 can be defined with respect to any one of the multi-bit memory devices. Alternatively, any one multi-bit memory device can be defined as the first region 101.

FIG. 10 is a diagram showing another address scramble manner of a multi-bit memory device in which 4-bit data is stored in a memory cell and a reprogram method is used.

An address scramble manner illustrated in FIG. 10 may be applied to a multi-bit memory device storing 4-bit data per cell. A data storage system using the address scramble manner illustrated in FIG. 10 may operate similarly to that described above. For example, when data of a minimum program unit on the first region 101 is stored in a buffer memory 201, a memory controller 200 may control a multi-bit memory device 100 such that data stored in the buffer memory 201 is programmed in the first region 101. Likewise, the memory controller 200 may judge whether data of a minimum program unit on the second region 102 is prepared in the first region 101 and control the multi-bit memory device 100 such that a 1-step program operation, a coarse program operation, and a fine program operation are executed according to the judgment. Such operations may be made according to patterns in FIG. 10 based on page address information.

Figure 11:
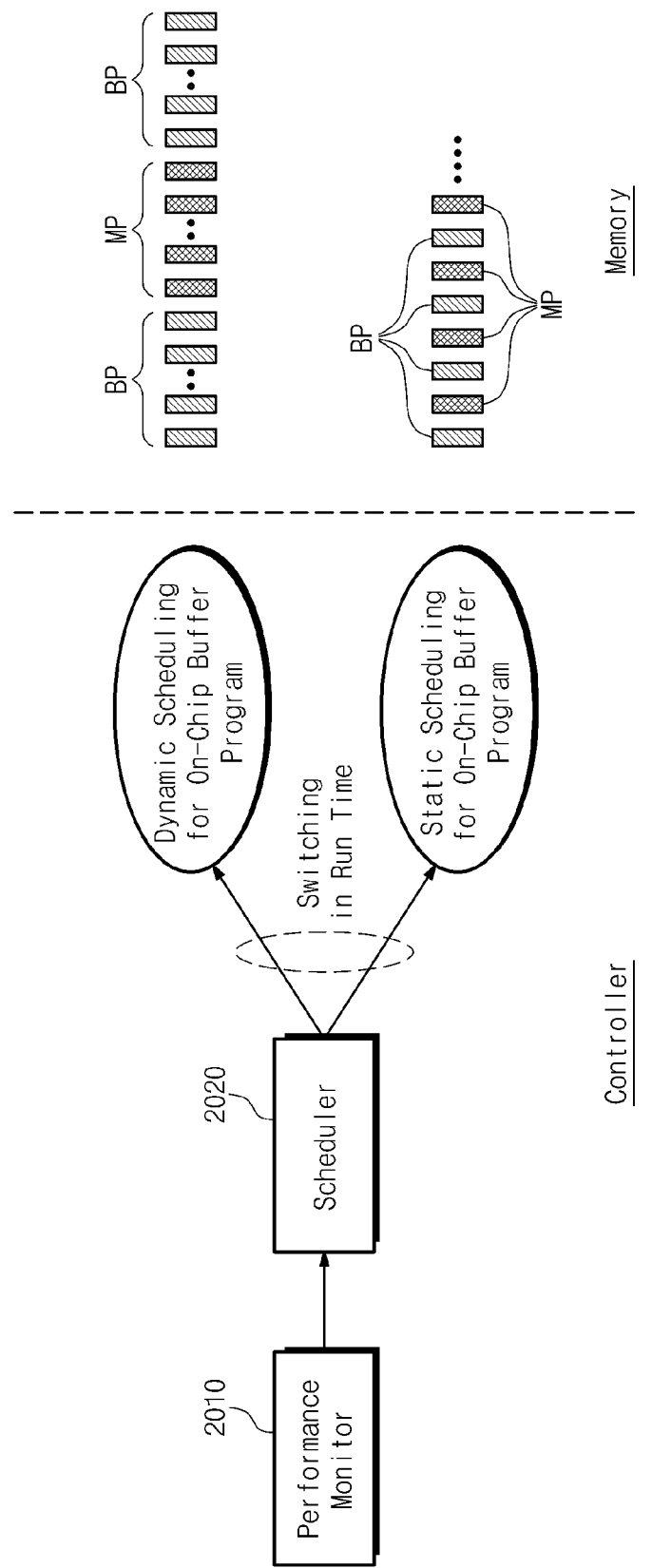
FIG. 11 is a diagram for describing an overall operation of a data storage device according to an exemplary embodiment.

FIG. 11 is a diagram for describing an overall operation of a data storage device according to an exemplary embodiment.

Referring to FIG. 11, a performance monitor block 2010 may measure a data throughput (or, bandwidth). The data throughput may be an average of data processed during a predetermined period of time. A scheduler 2020 may select one of static and dynamic scheduling manners based upon the data throughput measured by the performance monitor block 2010. That is, switching between the static and dynamic scheduling manners may be made in real time. In the event that the static scheduling manner is selected, a buffer program operation BP and a main program operation MP may be performed. For ease of illustration, there is exemplarily shown the case that the buffer and main program operations BP and MP are performed in turn, such that main program operations are triggered when a sufficient number of pages of data have been stored in a first memory region to program a word line in the second memory region. The order of the buffer and main program operations BP and MP may be determined according to an address scramble manner described in FIGS. 4 and 5. If the dynamic scheduling manner is selected, as illustrated in FIG. 11, a set of buffer program operations may be performed, for example, for a predetermined period of time, and then a set of main program operations may be made.

In an exemplary embodiment, the performance monitor block 2010 and the scheduler 2020 may be implemented by hardware. Alternatively, functions of the performance monitor block 2010 and the scheduler 2020 may be implemented by firmware or software driven by a processing unit 230. Alternatively, functions of the performance monitor block 2010 and the scheduler 2020 may be implemented by a combination of hardware, firmware, and software.

Figure 12:
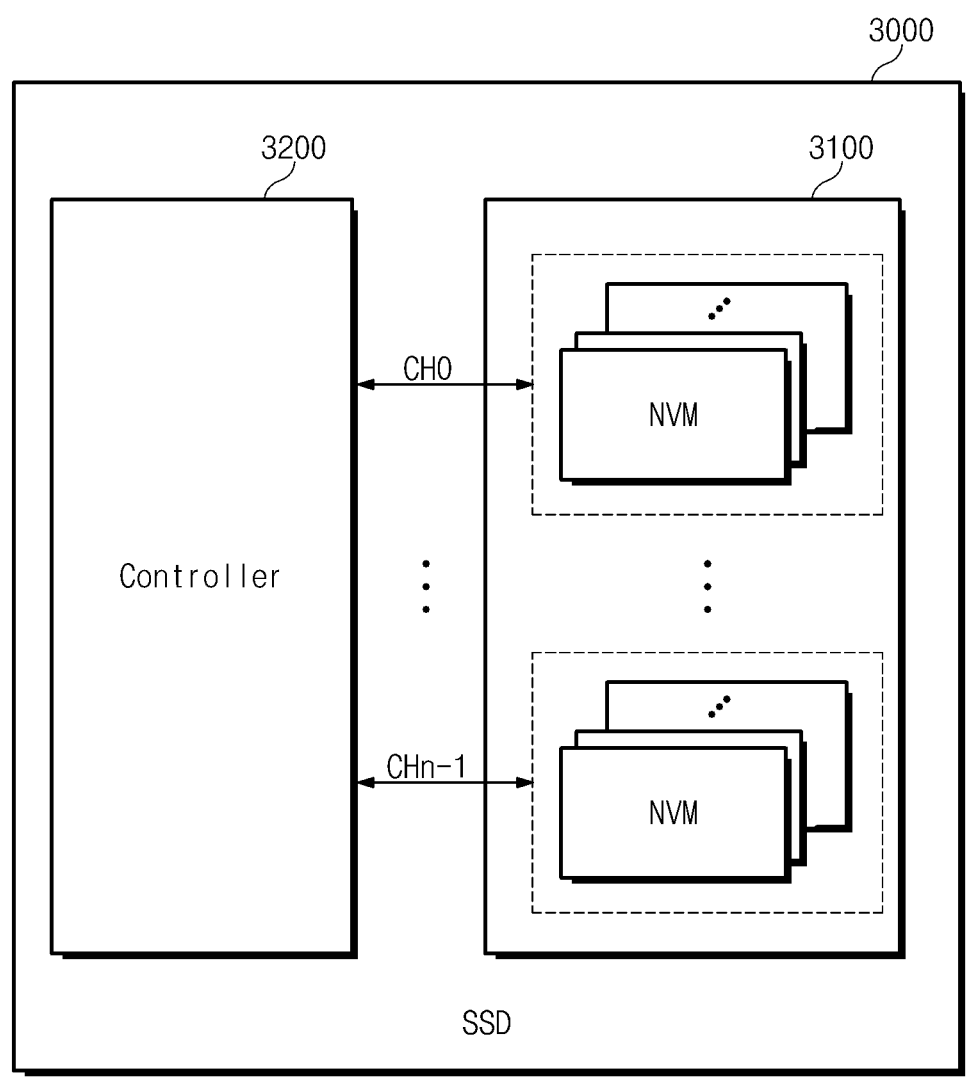
FIG. 12 is a block diagram showing a solid state drive according to an exemplary embodiment.

FIG. 12 is a block diagram showing a solid state drive according to an exemplary embodiment.

Referring to FIG. 12, a solid state drive (SSD) 3000 may comprise storage media 3100 and a controller 3200. The storage media 3100 may be connected with the controller 3200 via a plurality of channels, each of which is commonly connected with a plurality of non-volatile memory devices. Each non-volatile memory device may be formed of a memory such as described in connection with FIG. 2. The controller 3200 may be configured to perform an on-chip buffer program operation according to a scheduling manner (e.g., a static scheduling manner or a dynamic scheduling manner) determined in real time considering the performance. It is possible to minimize a size of a buffer memory included in the controller 3200 via the on-chip buffer program operation and to manage the performance effectively via a performance-aware scheduling manner.

Figure 13:
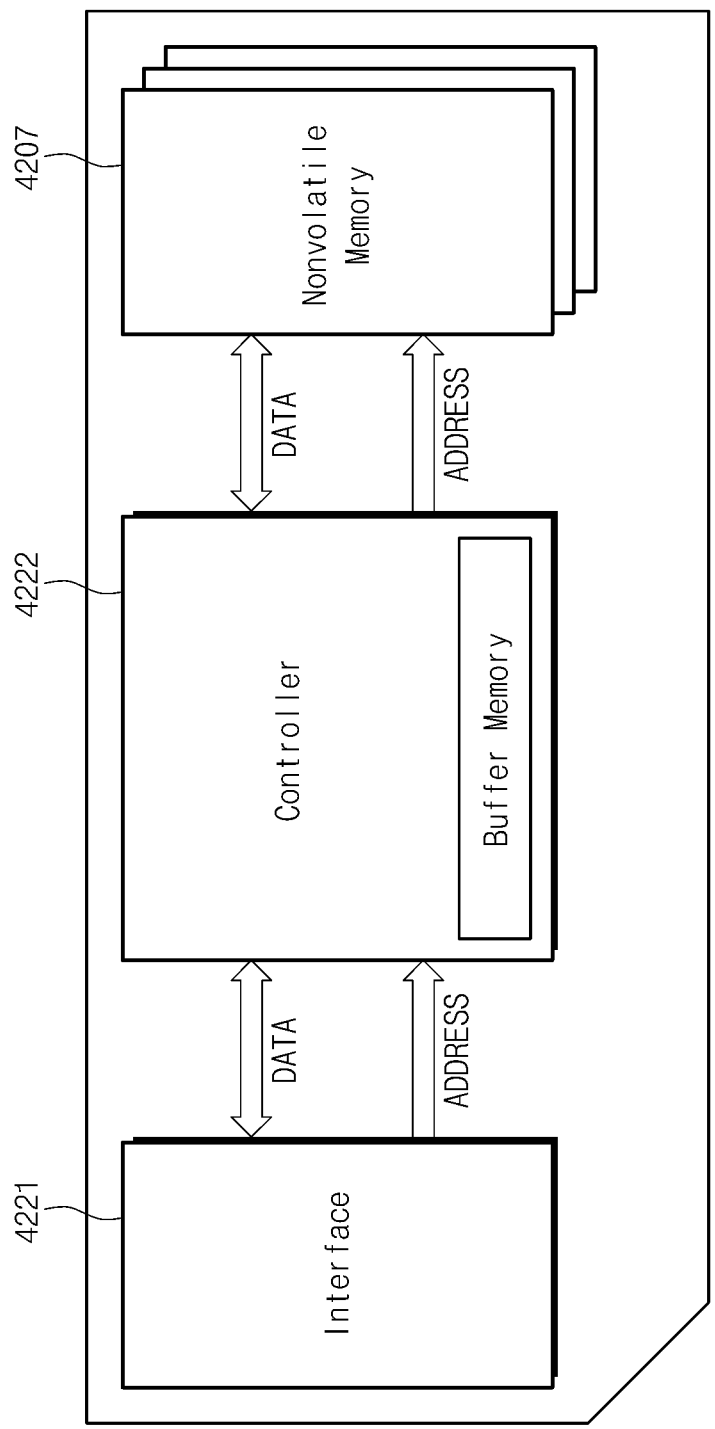
FIG. 13 is a block diagram showing a memory card according to an exemplary embodiment.

FIG. 13 is a block diagram illustrating a memory card according to an exemplary embodiment.

A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 13, the memory card may include an interface circuit 4221 for interfacing with an external device, a controller 4222 including a buffer memory and controlling an operation of the memory card, and at least one non-volatile memory device 4207 according to certain embodiments. The controller 4222 may be a processor which is configured to control write and read operations of the non-volatile memory device 4207. In particular, the controller 4222 may be coupled with the non-volatile memory device 4207 and the interface circuit 4221 via a data bus and an address bus. The controller 4222 and the non-volatile memory device 4207 may correspond to a memory controller 200 and a multi-bit memory device 100 described in FIG. 2, respectively. The controller 4222 may be configured to perform an on-chip buffer program operation according to a scheduling manner (e.g., a static scheduling manner or a dynamic scheduling manner) determined in real time considering the performance. It is possible to minimize a size of a buffer memory included in the controller 4222 via the on-chip buffer program operation and to manage the performance effectively via a performance-aware scheduling manner.

In an exemplary embodiment, memory cells may be formed of one of various cell structures having a charge storage layer. Cell structures having a charge storage layer may include a charge trap flash structure using a charge trap layer, a stack flash structure in which arrays are stacked in a multiple layer, a source-drain free flash structure, a pin-type flash structure, etc.

A memory device having a charge trap flash structure as a charge storage layer is disclosed in U.S. Pat. Nos. 6,858,906, 7,253,467 and U.S. Patent Publication Nos. 2004/0169238 and 2006/0180851, the entirety of which are incorporated by reference herein. A source-drain free flash structure is disclosed in KR Patent No. 673020, the entirety of which is incorporated by reference herein.

A memory device and/or a memory controller according to the disclosed embodiments may be packed using various types of packages. For example, A non-volatile memory device or a memory controller according to the inventive concept may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope. Thus, the scope is to be determined by the broadest permissible interpretation of the following claims and their equivalents, and shall not be restricted or limited by the foregoing detailed description.

What is claimed is:

1. An on-chip buffer program method for a data storage device which comprises a multi-bit memory device and a memory controller, the on-chip buffer program method comprising:
measuring a performance of the data storage device;
judging whether the measured performance satisfies a target performance of the data storage device; and
selecting one of a plurality of scheduling manners as an on-chip buffer program scheduling manner of the data storage device according to the judgment result,
wherein the on-chip buffer program scheduling manner includes a buffer program operation and a main program operation and the plurality of scheduling manners include a static scheduling manner, in which the buffer program operation and the main program operation are performed sequentially according to a given order, and a dynamic scheduling manner in which the buffer program operation is continuously carried out without execution of the main program operation, delayed main program operations of the dynamic scheduling manner being made after continuous execution of the buffer program operation, and
wherein the multi-bit memory device comprises a memory cell array defined into a first region and a second region, the first region being formed of memory cells each designated to store 1-bit data and the second region being formed of memory cells each designated to store M-bit data (M being an integer of 3 or more).

2. The on-chip buffer program method of claim 1, wherein the main program operations delayed according to the dynamic scheduling manner are made after a predetermined period of time during which the buffer program operations are made continuously.

3. The on-chip buffer program method of claim 1, wherein the buffer program operation is triggered according to a control of the memory controller when data corresponding to a minimum program unit of the first region is stored in a buffer memory of the memory controller, the main program operation is triggered according to a control of the memory controller when data corresponding to a minimum program unit of the second region is stored in the first region, and the main program operation includes at least one of a 1-step program operation, a coarse program operation, or a fine program operation.

4. The on-chip buffer program method of claim 1, wherein the main program operation includes a single-bit read operation for reading data from the first region and a multi-bit program operation for storing data read from the first region in the second region, the single-bit read operation being iteratively made according to the main program operation.

5. The on-chip buffer program method of claim 1, wherein the performance of the data storage device is determined on the basis of the amount of data processed during a reference period of time.

6. The on-chip buffer program method of claim 1, wherein the target performance is a predetermined minimum throughput threshold, and if the measured performance is below the target performance of the data storage device, the dynamic scheduling manner is selected.

7. The on-chip buffer program method of claim 6, wherein if the measured performance is above the target performance of the data storage device, the static scheduling manner is selected.

8. A data storage device comprising:
a multi-bit memory device having a memory cell array defined into a first region and a second region; and
a memory controller having a buffer memory and configured to control the multi-bit memory device,
wherein the memory controller controls the multi-bit memory device to perform a buffer program operation in which data stored in the buffer memory is stored in the first region and a main program operation in which data stored in the first region is stored in the second region,
wherein the memory controller changes an on-chip buffer program scheduling manner of the buffer and main program operations based upon a throughput of data processed during a reference period of time, and
wherein the first region is formed of memory cells each designated for storing 1-bit data and the second region is formed of memory cells each designated for storing M-bit data (M being an integer of 3 or more).

9. The data storage device of claim 8, wherein the on-chip buffer program scheduling manner includes a static scheduling manner in which the buffer program operation and the main program operation are performed sequentially according to a given order, and a dynamic scheduling manner in which the buffer program operation is continuously carried out without execution of the main program operation, main program operations being delayed a predetermined amount according to the dynamic scheduling manner and being made after continuous execution of the buffer program operation.

10. The data storage device of claim 9, wherein the throughput of data is determined on the basis of the amount of data processed during the reference period of time and a performance of the data storage device is determined on the basis of the throughput of data, and
wherein the dynamic scheduling manner is selected when the determined performance does not satisfy a target performance of the data storage device, and the static scheduling manner is selected when the determined performance satisfies the target performance of the data storage device.

11. The data storage device of claim 9, wherein the main program operations delayed according to the dynamic scheduling manner are made after a predetermined period of time during which the buffer program operations are made continuously.

12. The data storage device of claim 9, wherein the buffer program operation is triggered according to a control of the memory controller when data corresponding to a minimum program unit of the first region is stored in a buffer memory of the memory controller, the main program operation is triggered according to a control of the memory controller when data corresponding to a minimum program unit of the second region is stored in the first region, and the main program operation includes at least one of a 1-step program operation, a coarse program operation, or a fine program operation.

13. A method of programming in a data storage device, comprising:

storing pages of data from a first buffer to a first memory cell region, thereby performing first programming stage operations;

storing pages of data from the first memory cell region to a second memory cell region, thereby performing second programming stage operations;

measuring a throughput performance of the data storage device; and based on the measured throughput performance, selecting a scheduling order for performing the first programming stage operations and the second programming stage operations, wherein the first memory cell region includes memory cells designated for storing 1-bit data, and the second memory cell region includes memory cells designated for storing 3-bit or higher-bit data.

14. The method of claim 13, wherein selecting the scheduling order comprises:

selecting between a first scheduling order in which the performance of second programming stage operations are triggered by the completion of particular first programming stage operations, and a second scheduling order in which the performance of second programming stage operations are triggered based on a predetermined period of time, or an amount of pages available to be programmed in the first memory cell region.

15. The method of claim 14, further comprising:

switching from the first scheduling order to the second scheduling order when the measured throughput performance is below a threshold value.

16. The method of claim 14, wherein the second programming stage operations include one or more of a 1-step program operation that includes programming at least two bits of data to each memory cell being programmed, a coarse program operation that includes programming at least three bits of data to each memory cell being programmed, and a fine program operation that includes programming at least three bits of data to each memory cell being programmed.

\* \* \* \* \*